(12) United States Patent
Fu et al.

(10) Patent No.: US 12,525,505 B2
(45) Date of Patent: Jan. 13, 2026

(54) ELECTRONIC PACKAGE OF TWO VERTICALLY STACKED CHIPS WITH CHIP-TO-CHIP BUMP CONNECTIONS AND MANUFACTURING METHOD THEREOF

(71) Applicant: SILICONWARE PRECISION INDUSTRIES CO., LTD., Taichung (TW)

(72) Inventors: Yi-Min Fu, Taichung (TW); Chi-Ching Ho, Taichung (TW); Yu-Po Wang, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 668 days.

(21) Appl. No.: 17/829,533

(22) Filed: Jun. 1, 2022

(65) Prior Publication Data

US 2022/0399246 A1 Dec. 15, 2022

(30) Foreign Application Priority Data

Jun. 9, 2021 (TW) .................................. 110120989

(51) Int. Cl.
*H01L 23/373* (2006.01)
*H01L 21/56* (2006.01)
(Continued)

(52) U.S. Cl.
CPC .......... *H01L 23/3736* (2013.01); *H01L 21/56* (2013.01); *H01L 23/3157* (2013.01); *H01L 23/36* (2013.01); *H01L 23/49816* (2013.01); *H01L 24/14* (2013.01); *H01L 24/17* (2013.01); *H01L 25/0657* (2013.01); *H01L 21/568* (2013.01); *H01L 24/29* (2013.01); *H01L 2224/12105* (2013.01); *H01L 2224/13024* (2013.01); *H01L 2224/16227* (2013.01); *H01L 2224/29147* (2013.01); *H01L 2225/06548* (2013.01)

(58) Field of Classification Search
CPC ... H01L 23/3135; H01L 21/568; H01L 21/56; H01L 23/3157; H01L 23/31; H01L 23/28; H01L 25/074; H01L 25/0657
See application file for complete search history.

(56) References Cited

U.S. PATENT DOCUMENTS 8,319,338 B1 * 11/2012 Berry ................... H01L 25/0657
257/E23.116
8,446,017 B2 * 5/2013 Paek ....................... H01L 24/94
257/777
(Continued)

FOREIGN PATENT DOCUMENTS

CN 111952202 A * 11/2020 ............. H01L 21/50

*Primary Examiner* — Ratisha Mehta
*Assistant Examiner* — Adam Joseph Mott
(74) *Attorney, Agent, or Firm* — Dority & Manning, PA (57) ABSTRACT

An electronic package is provided, where a laterally diffused metal oxide semiconductor (LDMOS) type electronic structure is mounted onto a complementary metal oxide semiconductor (CMOS) type electronic element to be integrated into a chip module, thereby shortening electrical transmission path between the electronic structure and the electronic element so as to reduce the communication time between the electronic structure and the electronic element.

20 Claims, 5 Drawing Sheets

(51) Int. Cl.
*H01L 23/00* (2006.01)
*H01L 23/31* (2006.01)
*H01L 23/36* (2006.01)
*H01L 23/498* (2006.01)
*H01L 25/065* (2023.01)

(56) References Cited

U.S. PATENT DOCUMENTS

| | | | |
|---|---|---|---|
| 9,558,965 B2 * | 1/2017 | Chi | H01L 25/0652 |
| 10,211,183 B2 * | 2/2019 | Lin | H10D 86/85 |
| 10,410,970 B1 * | 9/2019 | Chiu | H01L 23/5386 |
| 10,431,556 B2 * | 10/2019 | Usami | H01L 23/49816 |
| 10,535,632 B2 * | 1/2020 | Jeng | H01L 24/20 |
| 11,004,810 B2 * | 5/2021 | Wu | H01L 23/5386 |
| 11,532,529 B2 * | 12/2022 | Yu | H01L 24/82 |
| 11,532,594 B2 * | 12/2022 | Yu | H01L 21/56 |
| 11,742,564 B2 * | 8/2023 | Liu | H01L 24/20 |
| | | | 343/727 |
| 11,973,047 B2 * | 4/2024 | Kao | H01L 21/6835 |
| 2014/0264831 A1 * | 9/2014 | Meyer | H01L 23/49838 |
| | | | 257/737 |
| 2015/0061095 A1 * | 3/2015 | Choi | H01L 23/5385 |
| | | | 257/777 |
| 2015/0279818 A1 * | 10/2015 | Hsu | H01L 21/4853 |
| | | | 257/737 |
| 2016/0133601 A1 * | 5/2016 | Ko | H01L 23/49827 |
| | | | 257/738 |
| 2016/0284638 A1 * | 9/2016 | Tan | H01L 24/11 |
| 2017/0084555 A1 * | 3/2017 | Yu | H01L 24/82 |
| 2017/0098629 A1 * | 4/2017 | Liu | H01L 24/20 |
| 2019/0237374 A1 * | 8/2019 | Huang | H01L 25/16 |

* cited by examiner

ELECTRONIC PACKAGE OF TWO VERTICALLY STACKED CHIPS WITH CHIP-TO-CHIP BUMP CONNECTIONS AND MANUFACTURING METHOD THEREOF

BACKGROUND

1. Technical Field

The present disclosure relates to a semiconductor device, and more particularly, to an electronic package having multiple chip modules and manufacturing method thereof.

2. Description of Related Art

Nowadays, terminal products for high-speed computing applications (such as autonomous driving, supercomputers, or mobile devices, etc.) are booming, and they are equipped with packaged semiconductor package elements (chips are bonded onto the packaging substrate), so that relevant terminal products can play a role and be applied to the aforementioned related fields.

Technologies currently used in the field of chip packaging include flip-chip packaging modules such as Chip Scale Package (CSP), Direct Chip Attached (DCA) package, or Multi-Chip Module (MCM) package, or technology for stacking chips into a three-dimensional integrated circuit (3D IC) chip, etc.

Figure 1:
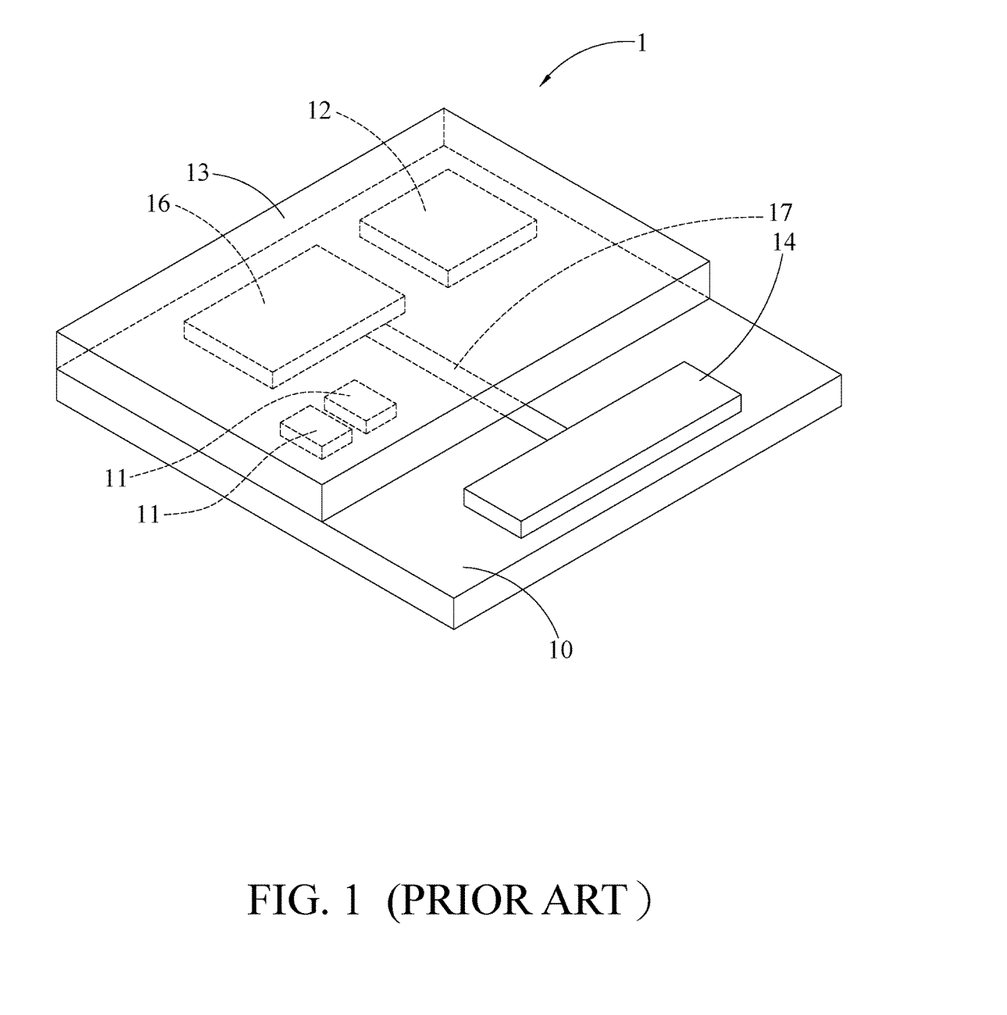
FIG. 1 is a schematic perspective view of a conventional electronic device.

FIG. 1 is a schematic perspective view of a conventional electronic device 1. As shown in FIG. 1, the electronic device 1 includes: a circuit board 10 provided with a plurality of chip elements 11, an electronic element 16 disposed on the circuit board 10, a functional element 12 and a packaging body 13.

In high-voltage power integrated circuits, a high-voltage Laterally Diffused Metal Oxide Semiconductor (LDMOS) type semiconductor chip (such as one chip specification of the chip elements 11) is usually used to meet high voltage resistance, achieving power control and other requirements, so as to facilitate the design of microwave/RF power circuits.

Moreover, the Complementary Metal-Oxide-Semiconductor (CMOS) type electronic element 16 is matched with the LDMOS type semiconductor chip, so as to provide a higher data transmission rate for multimedia services at the same time.

However, the LDMOS type semiconductor chip and the CMOS type electronic element 16 are respectively placed on different positions on the surface of the circuit board 10 in the conventional electronic device 1, so that the two types of chips need to be electrically connected by the circuits within the circuit board 10, which makes the signal transmission speed between the chip elements 11 and the electronic element 16 too slow and hard to achieve the electrical performance requirements of the current end products.

Also, the chip elements 11 and the electronic element 16 occupy too much layout area on the surface of the packaging area of the circuit board 10 (the layout area of the packaging body 13), so that the limited layout space of the circuit board 10 makes it hard to arrange more functional elements 12, which causes a single electronic device 1 to be unable to meet the requirements of current terminal products, such as lightness, thinness, small size, low power consumption, high electrical performance, etc.

On the other hand, if the functional element 14 with other functions (such as antenna function) needs to be added, the layout area of the circuit board 10 needs to be enlarged, such as the area outside the packaging body 13 shown in FIG. 1, wherein the functional element 14 is electrically connected to the electronic element 16 by a transmission line 17, and the packaging body 13 covers the chip elements 11 and a portion of the transmission line 17.

Therefore, there is a need for a solution that addresses the aforementioned shortcomings in the prior art.

SUMMARY

In view of the aforementioned shortcomings of the prior art, the present disclosure provides an electronic package, which comprises: an electronic element; an electronic structure disposed on and electrically connected to the electronic element, wherein the electronic element and the electronic structure are used as a chip module; at least one conductive pillar disposed on and electrically connected to the electronic element; and an encapsulation layer formed on the electronic element to cover the electronic structure and the conductive pillar.

The present disclosure further provides a method of manufacturing the electronic package, which comprises: disposing at least one electronic structure and at least one conductive pillar on an electronic element, wherein the electronic element is electrically connected to the electronic structure and the conductive pillar, and the electronic element and the electronic structure are used as a chip module; and forming an encapsulation layer on the electronic element to cover the electronic structure and the conductive pillar.

In the electronic package and manufacturing method thereof, the electronic structure is electrically connected to the electronic element via a plurality of conductive bumps. For example, the electronic structure is bonded to the conductive bumps via conductors.

In the electronic package and manufacturing method thereof, a surface of the encapsulation layer is flush with an end surface of the conductive pillar.

In the electronic package and manufacturing method thereof, an end surface of the conductive pillar is exposed from a surface of the encapsulation layer.

In the electronic package and manufacturing method thereof, the present disclosure further comprises forming at least one conductive element on the encapsulation layer, wherein the conductive element is electrically connected to the conductive pillar.

In the electronic package and manufacturing method thereof, the present disclosure further comprises forming a circuit structure on the encapsulation layer, wherein the circuit structure is electrically connected to the conductive pillar. For example, the present disclosure further comprises forming at least one conductive element on the circuit structure, wherein the conductive element is electrically connected to the circuit structure. Alternatively, the circuit structure is in a form of a single metal layer. Alternatively, the circuit structure is in contact with the electronic structure.

In the electronic package and manufacturing method thereof, the present disclosure further comprises covering around the electronic element by a packaging layer, and forming the encapsulation layer on the packaging layer to cover the electronic structure and the conductive pillar.

As can be understood from the above, the electronic package and manufacturing method thereof according to the present disclosure, the electronic structure is mainly stacked on the electronic element to closely match the electronic element. Thus, compared to the prior art, the electronic package of the present disclosure can save the placement space or placement area on the circuit board or the carrier board of the end product, so it is beneficial to the element arrangement of the circuit board or the carrier board of the end product, so that the electronic components having other functions can be further arranged on other layout areas of the circuit board or the carrier board of the end product as required.

Furthermore, since the electronic element and the electronic structure are integrated into a chip module, the electrical transmission path between the electronic element and the electronic structure is shortened, thereby reducing the communication time between the electronic element and the electronic structure. Therefore, compared to the prior art, the electronic package of the present disclosure can be more fitting with the electrical performance requirements of end products.

DETAILED DESCRIPTION

Implementations of the present disclosure are described below by embodiments. Other advantages and technical effects of the present disclosure can be readily understood by one of ordinary skill in the art upon reading the disclosure of this specification.

It should be noted that the structures, ratios, sizes shown in the drawings appended to this specification are provided in conjunction with the disclosure of this specification in order to facilitate understanding by those skilled in the art. They are not meant, in any ways, to limit the implementations of the present disclosure, and therefore have no substantial technical meaning. Without influencing the effects created and objectives achieved by the present disclosure, any modifications, changes or adjustments to the structures, ratios or sizes are construed as fall within the scope covered by the technical contents disclosed herein. Meanwhile, terms such as "above," "first," "second," "one," "a," "an," and the like, are for illustrative purposes, and are not meant to limit the scope implementable by the present disclosure. Any changes or adjustments made to the relative relationships, without substantially modifying the technical contents, are also to be construed as within the scope implementable by the present disclosure.

FIGS. 2A to 2F are schematic cross-sectional views illustrating a method for fabricating an electronic package 2 in accordance with a first embodiment of the present disclosure.

Figure 2A:
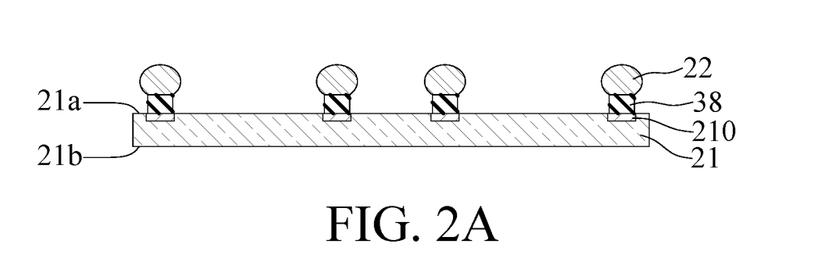
FIGS. 2A to 2F are schematic cross-sectional views illustrating a method for fabricating an electronic package in accordance with a first embodiment of the present disclosure.

As shown in FIG. 2A, an electronic structure 21 is provided, and the electronic structure 21 has a first side 21a and a second side 21b opposing to the first side 21a.

In an embodiment, the electronic structure 21 is an active element, such as a Laterally Diffused Metal Oxide Semiconductor (LDMOS) type semiconductor chip, the first side 21a of which is provided with a plurality of conductors 38 for bonding conductive bumps 22. For example, the first side 21a of the electronic structure 21 has a plurality of electrode pads 210 for bonding the conductors 38.

Figure 2B:
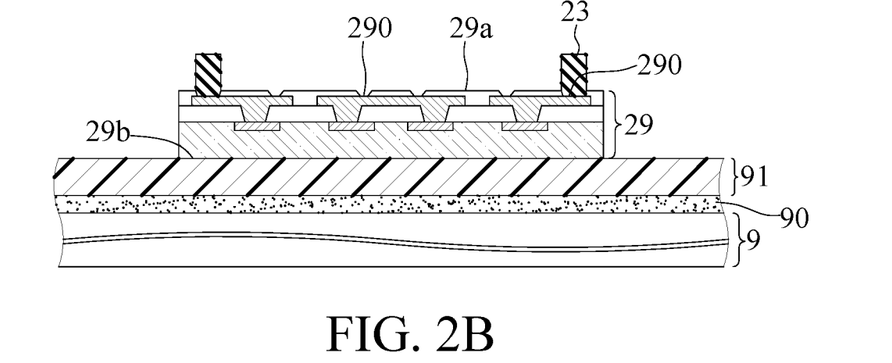

As shown in FIG. 2B, an electronic element 29 is provided and disposed on a carrier board 9, and a plurality of conductive pillars 23 are formed on the electronic element 29.

The electronic element 29 can be an active element, a passive element, or a combination of both, wherein the active element is, for example, a semiconductor chip, and the passive element is, for example, a resistor, a capacitor, or an inductor. In an embodiment, the electronic element 29 is a semiconductor chip, such as a Complementary Metal-Oxide-Semiconductor (CMOS) type functional chip, which has an active surface 29a and a non-active surface 29b opposing to the active surface 29a, and the active surface 29a has a plurality of electrode pads 290 thereon, and the electronic element 29 is arranged on the carrier board 9 by the non-active surface 29b.

In addition, the carrier board 9 is, for example, a board body made of semiconductor material (such as silicon or glass), on which a release layer 91 (or an adhesive layer 90) can be formed as required, such that the electronic element 29 can be disposed on the release layer 91.

Also, the conductive pillars 23 are disposed on a portion of the electrode pads 290 of the electronic element 29 and electrically connected to the electrode pads 290, and the conductive pillars 23 are formed by a metal material such as copper or a solder material.

Figure 2C:
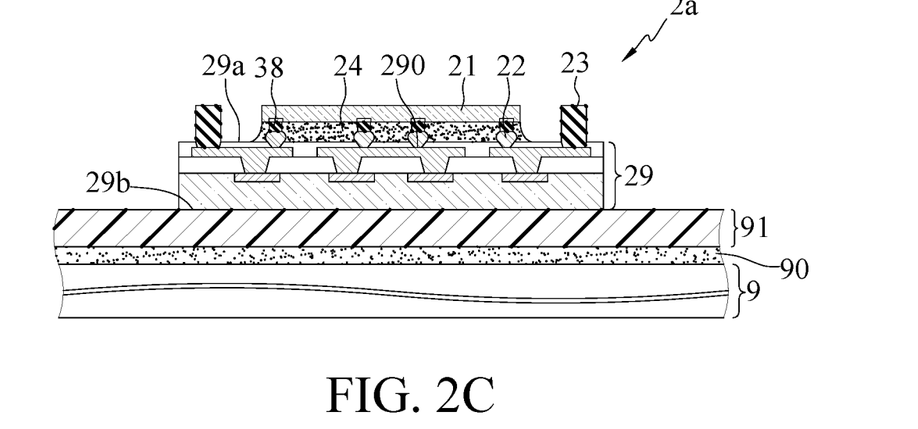

As shown in FIG. 2C, the electronic structure 21 is disposed on the active surface 29a of the electronic element 29 by the conductive bumps 22 of the electronic structure 21.

In an embodiment, the electronic structure 21 is bonded onto another portion of the electrode pads 290 of the electronic element 29 in a manner of flip-chip by the plurality of conductive bumps 22 to electrically connect the electrode pads 290. For example, the conductive bumps 22 and the conductors 38 can be covered with a bonding layer 24 (such as an underfill) as required.

Figure 2D:
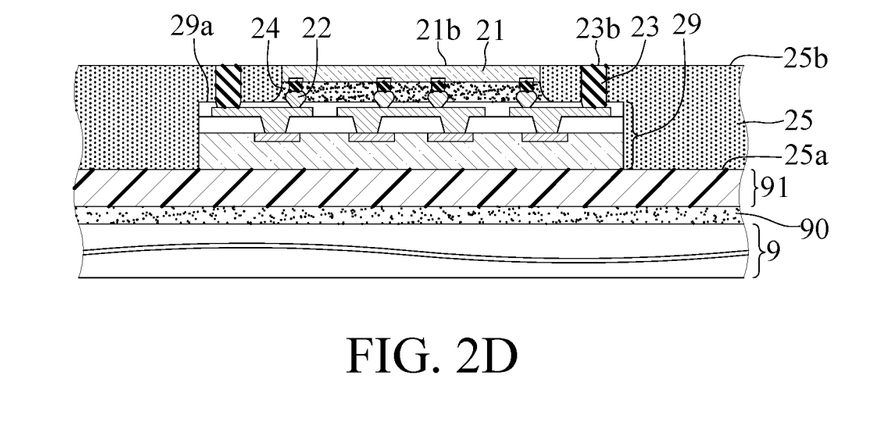

As shown in FIG. 2D, an encapsulation layer 25 is formed on the release layer 91 of the carrier board 9 and on the active surface 29a of the electronic element 29 to cover the electronic structure 21, the bonding layer 24 and the conductive pillars 23, wherein the encapsulation layer 25 has a first surface 25a and a second surface 25b opposing to the first surface 25a, and the encapsulation layer 25 is bonded to the release layer 91 of the carrier board 9 by the first surface 25a. Then, by using a flattening process, the second surface 25b of the encapsulation layer 25 is flush with an end surface 23b of each of the conductive pillars 23 and the second side 21b of the electronic structure 21, such that the end surface 23b of each of the conductive pillars 23 and the second side 21b of the electronic structure 21 are exposed from the second surface 25b of the encapsulation layer 25.

In an embodiment, the encapsulation layer 25 is an insulating material, such as polyimide (PI), dry film, epoxy resin, or molding compound, and can be formed on the carrier board 9 in a manner of lamination or molding.

Further, the flattening process uses grinding to remove a portion of the conductive pillars 23, a portion of the second side 21b of the electronic structure 21 and a portion of the encapsulation layer 25.

Also, if the bonding layer 24 is not formed, the encapsulation layer 25 can cover the conductive bumps 22 and the conductors 38.

Figure 2E:
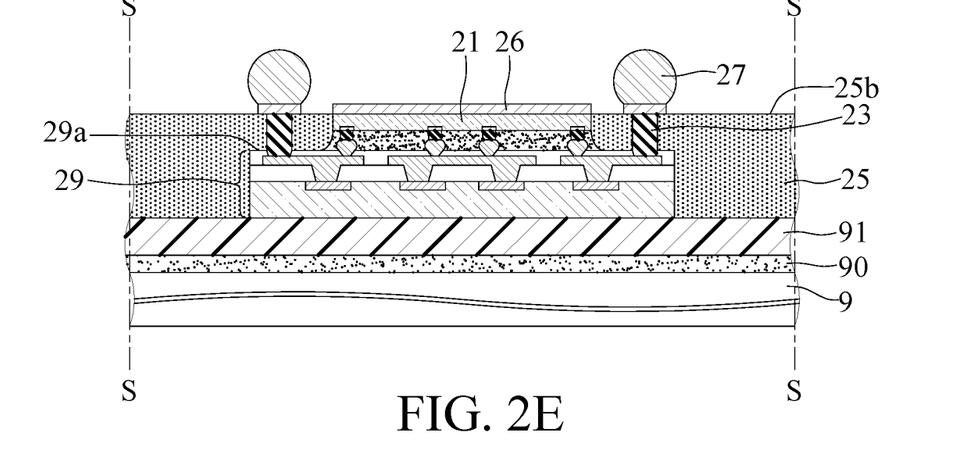

As shown in FIG. 2E, a circuit structure 26 is formed on the second surface 25b of the encapsulation layer 25, and the circuit structure 26 is electrically connected to the conductive pillars 23 and is in contact with the second side 21b of the electronic structure 21.

In an embodiment, the circuit structure 26 is in the form of a single metal layer. For example, the metal layer is made of copper and is in contact with the electronic structure 21 for heat dissipation.

Further, a plurality of conductive elements 27, such as solder balls, may be formed on the circuit structure 26.

Figure 2F:
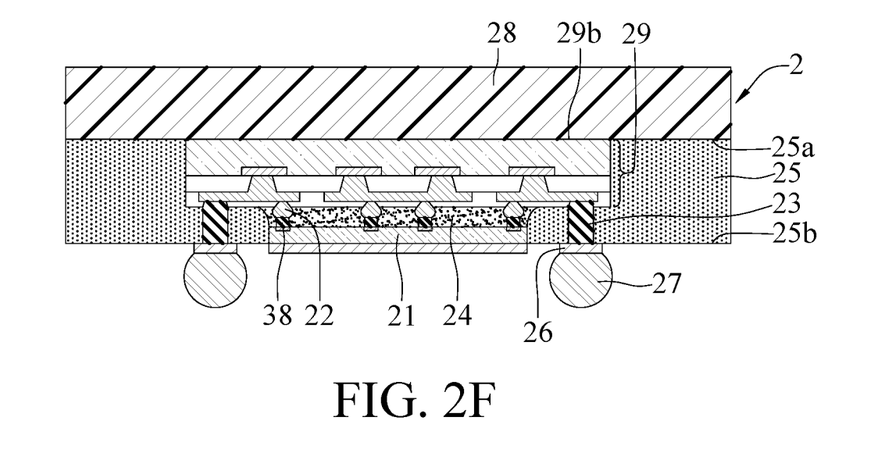

As shown in FIG. 2F, the carrier board 9 and the release layer 91 and adhesive layer 90 formed thereon are removed to expose the non-active surface 29b of the electronic element 29 and the first surface 25a of the encapsulation layer 25, then a singulation process is performed along cutting paths S as shown in FIG. 2E to obtain the electronic package 2.

In an embodiment, the electronic package 2 can be attached onto an electronic device (not shown) such as a circuit board via the conductive elements 27 in subsequent processes.

Furthermore, the electronic package 2 can be configured with a heat dissipation structure 28, such as a heat dissipation frame, a heat dissipation fin, a heat dissipation glue or other suitable heat dissipation materials, on the first surface 25a of the encapsulation layer 25 as required, where the heat dissipation structure 28 contacts the non-active surface 29b of the electronic element 29.

Therefore, the manufacturing method of the present disclosure integrates the CMOS (such as the electronic element 29) and LDMOS (such as the electronic structure 21) into a chip module 2a, as shown in FIG. 2C, to save the placement space or placement area on the circuit board or the carrier board of the end product. Therefore, compared to the prior art, the electronic package 2 of the present disclosure is beneficial to the element arrangement of the circuit board or the carrier board of the end product, such that the electronic components having other functions can be further arranged on other layout areas of the circuit board or the carrier board of the end product as required.

Furthermore, since the CMOS (such as the electronic element 29) and the LDMOS (such as the electronic structure 21) are integrated into a chip module 2a, the electrical transmission path between the electronic element 29 and the electronic structure 21 is shortened so as to reduce the communication time between the electronic element 29 and the electronic structure 21. Therefore, compared to the prior art, the electronic package 2 of the present disclosure can be more fitting with the electrical performance requirements of end products.

FIGS. 3A to 3F are schematic cross-sectional views illustrating a method for fabricating an electronic package 3 in accordance with a second embodiment of the present disclosure. The difference between the second embodiment and the first embodiment lies in the aspect of packaging, and other manufacturing processes are roughly the same, so similarities between the two will not be provided to avoid repetitions.

Figure 3A:
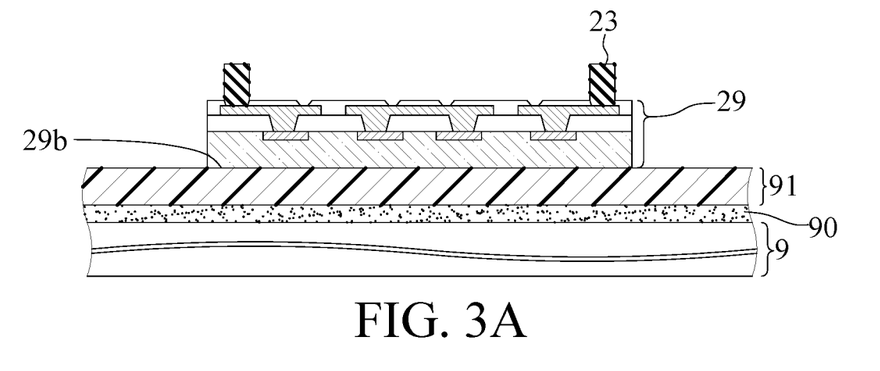
FIGS. 3A to 3F are schematic cross-sectional views illustrating a method for fabricating an electronic package in accordance with a second embodiment of the present disclosure.

As shown in FIG. 3A, the processes shown in FIG. 2A to FIG. 2B are first used.

Figure 3B:
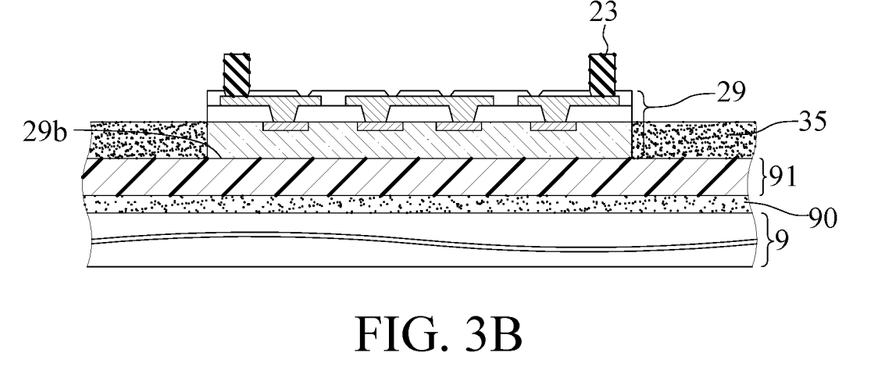

As shown in FIG. 3B, a packaging layer 35 is formed on the release layer 91 of the carrier board 9 to cover around the electronic element 29.

In an embodiment, the packaging layer 35 is an insulating material, such as polyimide (PI), dry film, epoxy resin, or molding compound, formed on the carrier board 9 in a manner of lamination or molding.

Figure 3C:
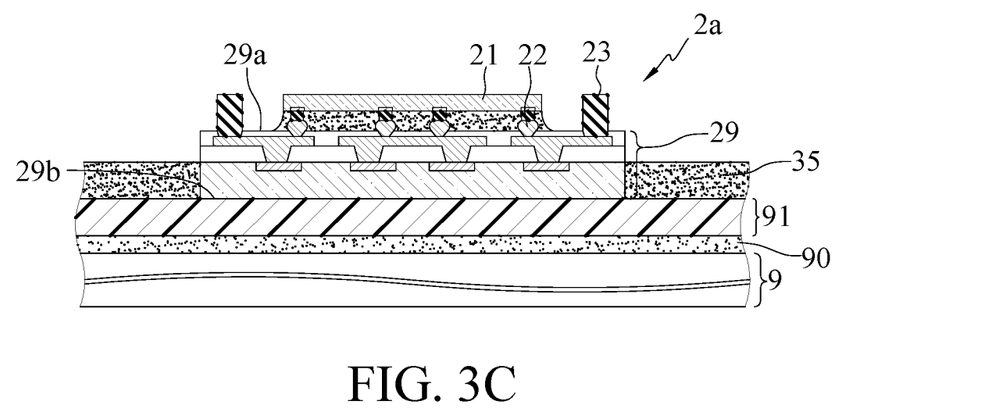

As shown in FIG. 3C, the electronic structure 21 is disposed on the active surface 29a of the electronic element 29 by the conductive bumps 22 of the electronic structure 21.

Figure 3D:
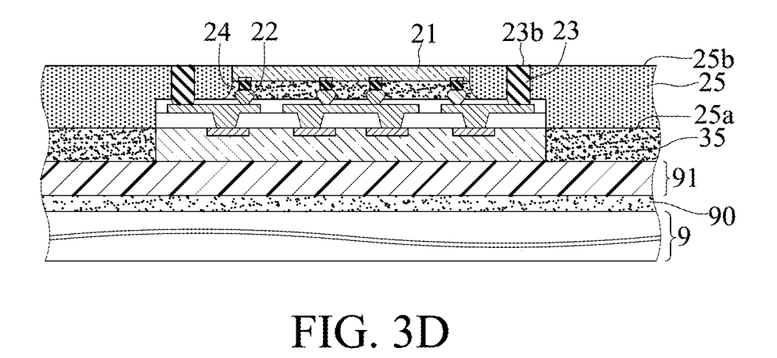

As shown in FIG. 3D, an encapsulation layer 25 is formed on the packaging layer 35 and on the active surface 29a of the electronic element 29 to cover the electronic structure 21, the bonding layer 24 and the conductive pillars 23, wherein the encapsulation layer 25 is bonded to the packaging layer 35 by the first surface 25a thereof. Then, a flattening process is performed.

In an embodiment, the encapsulation layer 25 and the packaging layer 35 may be made of the same or different materials as required.

Figure 3E:
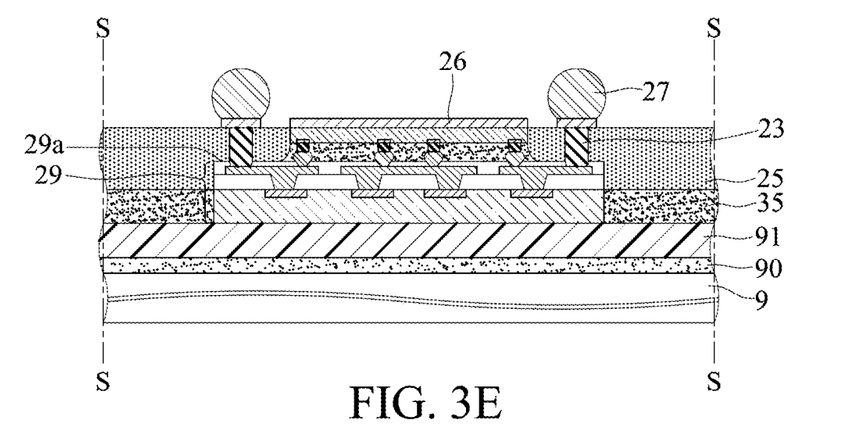

As shown in FIG. 3E, a circuit structure 26 is formed on the second surface 25b of the encapsulation layer 25, and a plurality of conductive elements 27 (e.g., solder balls) are formed on the circuit structure 26.

Figure 3F:
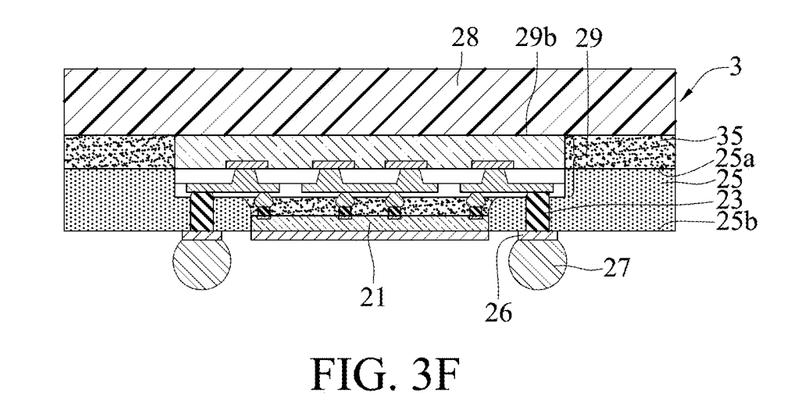

As shown in FIG. 3F, the carrier board 9 and the release layer 91 and the adhesive layer 90 thereon are removed to expose the non-active surface 29b of the electronic element 29 and the packaging layer 35, then a singulation process is performed along the cutting paths S as shown in FIG. 3E to obtain the electronic package 3. Further, the packaging layer 35 may be configured with a heat dissipation structure 28 (such as heat dissipation fins), which contacts the non-active surface 29b of the electronic element 29.

The present disclosure further provides an electronic package 2, 3, which comprises: an electronic structure 21, an electronic element 29, a plurality of conductive pillars 23 and an encapsulation layer 25.

The electronic structure 21 is disposed on the electronic element 29 and electrically connected to the electronic element 29, such that the electronic element 29 and the electronic structure 21 are used as a chip module 2a.

The conductive pillars 23 are disposed on the electronic element 29 and electrically connected to the electronic element 29.

The encapsulation layer 25 is formed on the electronic element 29 to cover the electronic structure 21 and the conductive pillars 23.

In an embodiment, the electronic structure 21 is electrically connected to the electronic element 29 by a plurality of conductive bumps 22. For example, the electronic structure 21 is bonded to the conductive bumps 22 by the conductors 38.

In an embodiment, a second surface 25b of the encapsulation layer 25 is flush with an end surface 23b of each of the conductive pillars 23.

In an embodiment, the end surface 23b of each of the conductive pillars 23 is exposed from the second surface 25b of the encapsulation layer 25.

In an embodiment, the electronic package 2, 3 further comprises a plurality of conductive elements 27 formed on the encapsulation layer 25 and electrically connected to the conductive pillars 23.

In an embodiment, the electronic package 2, 3 further comprises a circuit structure 26 formed on the encapsulation layer 25 and electrically connected to the conductive pillars 23. Furthermore, the electronic package 2, 3 further comprises a plurality of conductive elements 27 formed on the circuit structure 26 and electrically connected to the circuit structure 26. For example, the circuit structure 26 is in the form of a single metal layer. Alternatively, the circuit structure 26 is in contact with the electronic structure 21.

In an embodiment, the electronic package 3 further comprises a packaging layer 35 covering around the electronic element 29, such that the encapsulation layer 25 is formed on the packaging layer 35.

In conclusion, in the electronic package and manufacturing method thereof of the present disclosure, the electronic structure is stacked on the electronic element to closely match the electronic element, such that there is no need to redesign the circuit board in the present disclosure, the manufacturing cost may be greatly reduced and no expansion of the size of the circuit board is required, which fits the needs of miniaturization and facilitates high electrical performance.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. An electronic package, comprising:
    an electronic element;
    an electronic structure disposed on and electrically connected to the electronic element, wherein the electronic element and the electronic structure are used as a chip module;
    at least one conductive pillar disposed on and electrically connected to the electronic element; and
    an encapsulation layer formed on the electronic element to cover the electronic structure and the conductive pillar, wherein the encapsulation layer covers around the electronic element; and
    a circuit structure formed on the encapsulation layer, wherein the circuit structure is not covered by a dielectric layer and is in thermal contact with the electronic structure for heat dissipation.

2. The electronic package of claim 1, wherein the electronic structure is electrically connected to the electronic element via a plurality of conductive bumps.

3. The electronic package of claim 2, wherein the electronic structure is bonded to the conductive bumps via conductors.

4. The electronic package of claim 1, wherein a surface of the encapsulation layer is flush with an end surface of the conductive pillar.

5. The electronic package of claim 1, wherein an end surface of the conductive pillar is exposed from a surface of the encapsulation layer.

6. The electronic package of claim 1, further comprising at least one conductive element formed on the encapsulation layer, wherein the conductive element is electrically connected to the conductive pillar.

7. The electronic package of claim 1, wherein the circuit structure is electrically connected to the conductive pillar.

8. The electronic package of claim 7, further comprising at least one conductive element formed on the circuit structure, wherein the conductive element is electrically connected to the circuit structure.

9. The electronic package of claim 1, wherein the circuit structure is in a form of a single metal layer.

10. The electronic package of claim 1, further comprising a packaging layer covering around the electronic element, wherein the encapsulation layer is formed on the packaging layer.

11. A method of manufacturing an electronic package, comprising:
    disposing at least one electronic structure and at least one conductive pillar on an electronic element, wherein the electronic element is electrically connected to the electronic structure and the conductive pillar, and the electronic element and the electronic structure are used as a chip module; and
    forming an encapsulation layer on the electronic element to cover the electronic structure and the conductive pillar, wherein the encapsulation layer covers around the electronic element; and
    forming a circuit structure on the encapsulation layer, wherein the circuit structure is not covered by a dielectric layer and is in thermal contact with the electronic structure for heat dissipation.

12. The method of claim 11, wherein the electronic structure is electrically connected to the electronic element via a plurality of conductive bumps.

13. The method of claim 12, wherein the electronic structure is bonded to the conductive bumps via conductors.

14. The method of claim 11, wherein a surface of the encapsulation layer is flush with an end surface of the conductive pillar.

15. The method of claim 11, wherein an end surface of the conductive pillar is exposed from a surface of the encapsulation layer.

16. The method of claim 11, further comprising forming at least one conductive element on the encapsulation layer, wherein the conductive element is electrically connected to the conductive pillar.

17. The method of claim 11, wherein the circuit structure is electrically connected to the conductive pillar.

18. The method of claim 17, further comprising forming at least one conductive element on the circuit structure, wherein the conductive element is electrically connected to the circuit structure.

19. The method of claim 11, wherein the circuit structure is in a form of a single metal layer.

20. The method of claim 11, further comprising covering around the electronic element by a packaging layer, and forming the encapsulation layer on the packaging layer to cover the electronic structure and the conductive pillar.

* * * * *